(12) United States Patent
Huhtasalo et al.

(10) Patent No.: US 7,386,936 B2
(45) Date of Patent: Jun. 17, 2008

(54) METHOD FOR MANUFACTURING IN ELECTRICALLY CONDUCTIVE PATTERN

(75) Inventors: Lauri Huhtasalo, Tampere (FI); Samuli Strömberg, Tampere (FI); Marko Hanhikorpi, Pirkkala (FI); Olli Hyvärinen, Pori (FI); Pekka Taskinen, Pori (FI); Tuija Suortti, Pori (FI)

(73) Assignee: Intune Circuits Oy (FI)

( * ) Notice: Subject to any disclaimer, the term of this patent is extended or adjusted under 35 U.S.C. 154(b) by 231 days.

(21) Appl. No.: 11/217,878

(22) Filed: Sep. 1, 2005

(65) Prior Publication Data

US 2006/0057827 A1 Mar. 16, 2006

Related U.S. Application Data

(63) Continuation of application No. PCT/FI03/00633, filed on Aug. 29, 2003.

(30) Foreign Application Priority Data

Mar. 5, 2003 (WO) .................. PCT/FI03/00168

(51) Int. Cl.
*H05K 3/02* (2006.01)
*H05K 3/00* (2006.01)
(52) U.S. Cl. .................. 29/846; 29/843; 156/230; 156/235; 156/240

(58) Field of Classification Search ............... 29/843, 29/846; 156/230, 235, 240
See application file for complete search history.

(56) References Cited

U.S. PATENT DOCUMENTS

| 5,407,511 | A | * | 4/1995 | Nakatani et al. ............ 156/230 |
| 5,460,922 | A | * | 10/1995 | Swirbel et al. ............. 430/315 |
| 5,855,716 | A | * | 1/1999 | Tonucci et al. ............. 156/230 |
| 6,074,893 | A | * | 6/2000 | Nakata et al. .............. 438/106 |
| 6,138,348 | A | * | 10/2000 | Kulesza et al. ............... 29/840 |
| 6,402,866 | B1 | * | 6/2002 | Casey et al. ............. 156/89.12 |
| 6,871,396 | B2 | * | 3/2005 | Sugaya et al. ................ 29/860 |

FOREIGN PATENT DOCUMENTS

| DE | 29905472 U1 | 7/1999 |
| DE | 19853018 C1 | 4/2000 |
| EP | 0991014 A2 | 4/2000 |
| WO | 03/009659 A1 | 1/2003 |

* cited by examiner

*Primary Examiner*—C. J Arbes
(74) *Attorney, Agent, or Firm*—Fitch, Even, Tabin & Flannery

(57) ABSTRACT

The present invention relates to a method for manufacturing an electrically conductive pattern by printing a layer comprising metal oxide on a carrier substrate (2) and reducing the metal oxide to metal. The reduced layer is transferred to an application substrate (7). The present invention also relates to the use of the method.

18 Claims, 5 Drawing Sheets

METHOD FOR MANUFACTURING IN ELECTRICALLY CONDUCTIVE PATTERN

RELATED APPLICATIONS

This is a continuation application of prior International Patent Application No. PCT/FI2003/000633 (designating the U.S.), filed Aug. 29, 2003. This application is also based on, and claims benefit of, International Patent Application No. PCT/FI03/00168, filed on Mar. 5, 2003, and which is incorporated by reference.

FIELD

The present invention relates to a method for manufacturing an electrically conductive pattern by printing a layer comprising metal oxide on a carrier substrate and reducing the metal oxide to metal. The present invention relates also to a use of the method.

BACKGROUND

In prior art relating to circuit board manufacture, e.g. in specification U.S. Pat. No. 5,261,950, a method is disclosed wherein a fine-grained copper oxide powder having a granular size of the order of 10 µm or less is used for the formation of a paste. The paste is formed from copper oxide powder, a binding agent, alloying elements and additives. From the paste, a blank of an electrically conductive pattern of desired shape is formed on the surface of a substrate. The blank on the surface of the substrate is reduced using e.g. hydrogen (i.e. metallized) and sintered using a high temperature to produce a continuous copper foil.

In prior-art methods of this type using copper oxide powder as a starting material, which is reduced and sintered to form a metallic copper foil, the aim is always that the copper foil should remain permanently fixed to the surface of the underlying substrate. For this purpose, the prior-art paste contains a glass additive, among other things, which forms a strong bond to the underlying ceramic substrate. Since the metallization and sintering are performed at a very high temperature, which usually has to be at least of the order of over 500° C. to ensure adequate sintering, the substrate must be made of a material having a good heat resistance, such as ceramic.

The prior-art method has the advantage that a copper foil, which has a good electric conductivity, can be formed by a fast and low-cost procedure from copper oxide, which is cheap and has the characteristics of an insulator. Copper oxide powder as a starting material is chemically stable, unlike e.g. pure copper powder, which is so active that it tends to oxidize. In addition, copper oxide is cheap. In the copper foil manufacturing process, no copper oxide is wasted, so the efficiency and yield are good.

The problem with the prior-art method is that it is not suited for use in the formation of a electrically conductive pattern in practical applications where an electrically conductive pattern formed from copper foil having good electrical conductivity is to be laminated onto a plastic or paper substrate. Such applications include e.g. inductive sensors and antennas for various electrotechnical applications. It is obvious that a plastic or paper substrate would be destroyed if it were exposed to high temperatures as mentioned above.

A special application, which uses thin conductive metal foil on a 20 plastic and/or paper substrate are transponders. The transponders refer in this application to products, which comprise a circuitry pattern and an integrated circuit on a chip. The circuitry pattern is located on a substrate, and the integrated circuit on the chip is electrically connected to the circuitry pattern.

The transponders can be activated e.g. by an external HF or UHF field, so they need no power source. The transponders can be used for the identification of objects (products, persons, animals, etc.) by using memory data stored in the integrated circuit on the chip. Identification takes place from a distance, which varies depending on the used technology and the effective regulations. For the identification, the antenna produces an electric current for the integrated circuit when in the field of a reader. The substrate of the transponder can be provided with an adhesive surface to allow it to be attached to an object. The transponders may be disposable, like those used on foodstuff and other consumer goods packages, being destroyed after use, or they may be designed for continuous use, such as those used in logistic applications, bankcards, personal identification cards or other ID applications.

A typical circuitry pattern of a transponder has a thickness of 5-50 µm. The printed circuitry pattern is generally produced by the silk-screen printing technique. Electrical conductivity is provided by using conductive powder, which may be produced from e.g. silver, copper and graphite. Besides printed antennas, antennas are nowadays also made from e.g. thin copper wires by coiling and flattening the wires so as to form a thin foil. Other production methods include evaporating and electrolytic or chemical precipitation. From a continuous copper foil, which may be produced by different methods, the unnecessary parts are etched away to create an antenna pattern. The portion to be etched away may well exceed 50%. As the removal of the extra metal requires separate work stages, efforts are continuously being made in the field to create an antenna that is as near net shape as possible already at an early stage of the manufacturing process.

There are also prior-art methods wherein an RF-ID antenna is formed by die cuffing from a thin metal foil. The problems are that in this manufacturing method the quality is poor and most of the metal foil is lost as waste.

Specification EP 0991014 discloses a photolithographic method of forming an RF-ID antenna from silver powder using various light sensitive films, at least one intermediate agent facilitating the processing and two types of conductive metallic powder. Silver is expensive, so the antenna produced by this method is also expensive.

Especially in an RF-ID application, there is the problem that RF-ID tag antennas produced by prior-art manufacturing methods are expensive, which is an impediment to their more widespread use in disposable applications, such as e.g. foodstuff packages.

Generally known is also a method for producing a thin continuous foil e.g. by an electrolytic precipitation process. This method involves a cathode drum rotating in an electrolysis vessel and an arc-shaped anode consisting of one or more parts in the bottom part of the vessel. An electrolyte is supplied between the anode and the cathode, and the aim is to precipitate a copper foil as continuous and uniform as possible onto the surface of the cathode drum. When the deposited foil rises above the electrolyte, it is detached from the cathode and passed on to a further treatment process. The method has been under development since the 1930's, and it is described e.g. in U.S. Pat. No. 2,044,415 and in published patent application US 2002/5363.

OBJECTS

The object of the present invention is to overcome the above-mentioned drawbacks.

A specific object of the invention is to disclose a simple method for producing a cheap electrically conductive pattern having a good electrical conductivity on a paper or plastic substrate.

A still further object of the invention is to disclose a compact manufacturing process of a transponder.

SUMMARY

A method for manufacturing an electrically conductive pattern is provided where the method generally includes printing a layer comprising metal oxide on a surface of a carrier substrate, reducing the metal oxide to metal, and transferring the reduced layer to an application substrate. The method is particularly useful and important in making transponders which include a substrate comprising paper or plastic. In this aspect, the transponders are made by printing an electrically conductive pattern comprising metal oxide on a carrier substrate, reducing the metal oxide to an electrically conductive metal, and transferring the reduced metal to a surface which is paper or plastic. Finally a manufacturing line to make an electrically conductive pattern and transponders also is provided.

The transponders refer in this application to products, which comprise a circuitry pattern and an integrated circuit on a chip. The circuitry pattern is located on a substrate, and the integrated circuit on the chip is electrically connected to the circuitry pattern. The chip can be attached to the circuitry pattern as a single chip without any substrate, or it can be attached to the circuitry pattern with a module comprising the chip and necessary leads on a substrate. The circuitry pattern can be a coil, or an antenna based on the dipole-antenna technique.

The electrically conductive pattern means in this application mainly the circuitry pattern but also the leads forming the electrical connection between the circuitry pattern and the chip include in the scope of the invention, as well as capacitor plates, which can be formed on the same substrate as the circuitry pattern. Also multi-layer structures belong to this context.

In this application, a metal refers to any metal or mixture of metals, which can be obtained by the method of the invention. Copper oxide is the preferred starting material, which is reduced to copper.

In the method, fine-grained copper oxide powder having a grain size of the order of 10 µm or less is provided for the formation of a paste; a paste is formed from copper oxide powder, a binding agent and possible alloying elements and additives; using the paste, a electrically conductive pattern of desired shape is formed on the surface of a carrier substrate; the electrically conductive pattern on the surface of the carrier substrate is metallized and sintered at an elevated temperature to form a continuous and electrically conductive copper foil.

According to the invention, the carrier substrate, which has a substantially non-adhesive surface made of a material capable of withstanding the elevated temperature used for the metallization and/or sintering and non-reacting with the substances contained in the paste, is arranged to allow the copper foil to be detached from the carrier substrate. After the metallization and sintering, the copper foil is detached from the carrier substrate and transferred onto the surface of an application substrate.

The copper oxide powder comprises copper(1)oxide, which is prepared from a water solution by precipitating at a controlled temperature, solution strength and other conditions controlling the properties and by drying to produce active, fine-grained, pure and homogeneous copper oxide powder. By precipitating from a water solution, sufficiently fine-grained and homogeneous powder is obtained. Correspondingly, the paste comprises fine-grained copper oxide powder having a grain size of the order of 10 µm or less and a binding agent. It is possible that the paste comprises also alloying elements and additives. The alloying element may be mixed in the copper oxide powder to form a homogeneous alloy, said alloying element being selected from the following group: silver, gold, platinum, palladium, oxides of silver, gold, platinum and palladium, halogenides of silver, gold, platinum, palladium or mixtures of these. By using alloying elements, the properties of the alloy can be improved.

The binding agent can be an organic binding agent, such as polyvinylbutyral (PVB) or dibutylphtalate (DBP), which is mixed in the paste. In addition, alloying elements serving to control the rheology, creep and/or adhesion may be mixed in the paste. The printability of the paste can be adjusted by using intermediate agents like these, which may be resins, various dispersing agents, solvents, etc.

The manufacturing line of the electrically conductive pattern comprises a forming device for forming the paste into a blank of an electrically conductive pattern having the shape of a desired electrically conductive pattern on the surface of the carrier substrate. In addition, the line comprises a metallizing and sintering device for metallizing and sintering the blank of the electrically conductive pattern on the surface of the carrier substrate at an elevated temperature to form a continuous and electrically conductive copper foil.

In the method of the invention the shape of the electrically conductive pattern is formed on a carrier substrate. The carrier substrate has a substantially non-adhesive surface of a material capable of withstanding the elevated temperature used for the metallization and/or sintering and non-reacting with the substances contained in the paste so that the electrically conductive pattern, i.e. the copper foil, can be detached from the carrier substrate. The carrier substrate may have a polished smooth substantially non-adhesive surface, which is made of graphite or ceramic material. The graphite surface, which is the preferred choice, has preferably a surface roughness $R_a$ of the order of 0.5 µm or less. Graphite is a cheap material having a good heat resistance. It is soft and can be easily polished by a simple technique to make it smooth enough to allow the copper foil to be readily detached from it, and it is regenerable for reuse so that it can be used multiple times.

To mention a few alternatives, the carrier substrate can be a plate for a single pattern, an endless conveyor comprising sequential plates, a smooth endless band, or a plate for multiple patterns. A preferred method for forming the blank of the electrically conductive pattern is silk printing. The blank of the electrically conductive pattern can be formed also by another impression printing technique in which case the forming device of the blank of the electrically conductive pattern a printing device. The blank of the electrically conductive pattern can also be formed by an output printing technique known from computer output technology in which case individual electrically conductive patterns of widely varying shapes can be easily created by a computer-aided method. In general, the printing method can be selected amongst silk, tampo, inkjet, laser, flexo, gravure and litho printing. Typically, the blank of the electrically conductive pattern has a thickness of about 5-100 μm.

The graphite substrate bearing the blank of the electrically conductive pattern is led to an oven in order to be reduced to elementary metal, i.e. to become the electrically conductive pattern. The metallization and sintering of the blank of the electrically conductive pattern to form a copper foil are performed in a hydrogen atmosphere in a chamber hermetically isolated from the environment. The chamber is provided with a heater, by means of which the electrically conductive pattern to be metallized and sintered is brought to a temperature exceeding 500° C., preferably of the order of 1000° C.

When the copper oxide is reduced to copper, a porous spongy structure is formed, which has to be sintered to make it coherent. Since the spongy metal structure has a large area, even as large as hundreds of square meters in a gram of material, it would tend to oxidize unless a hydrogen atmosphere was provided in the chamber.

In addition to hydrogen, the atmosphere may contain other gaseous substances, such as nitrogen. The other gaseous substances shall be inert. At a temperature of the order of 1000° C., thorough sintering takes place so that the spongy metal becomes sintered, i.e. solidified so as to form a continuous metal layer, which is simultaneously deactivated and will not oxidize again. When a temperature as mentioned above is used, the metallization and sintering take place quickly, in a few minutes, so the manufacturing process is fast and can be implemented on a continuous production line. To promote the reduction process, the copper oxide powder may be treated with an organic intermediate agent to form a reducing compound on the surfaces of the copper oxide particles of the powder. As an organic intermediate agent, e.g. acetic acid, oxalic acid and/or formic acid may be used. Metallization takes place by the aid and influence of these because they are reducing compounds. As it breaks down, such as an organic intermediate agent reduces the copper oxide next to it. The reducing intermediate agent added to the paste allows the metallization to be effected at a lower temperature. However, an organic intermediate agent alone is not sufficient without metallization performed at a high temperature, but it makes it possible to significantly reduce the temperature to be used, e.g. to 500° C. The electrically conductive pattern may be heated by infrared radiation or microwave radiation for its metallization and sintering. For this purpose, the manufacturing line may comprise an infrared radiation source or a microwave radiation source.

After the heat treatment step the graphite substrate and the electrically conductive pattern are cooled down to at least 170° C. It is possible that the electrically conductive pattern is cooled to even lower temperature, such as 100° C. or room temperature. For example, nitrogen gas can be used to protect the surface of the metal layer during cooling.

In some cases it may be necessary that the electrically conductive pattern must be rolled after the reduction step in order to achieve a suitable thickness, rigidity and strength. The electrically conductive pattern can be rolled while it remains on the carrier substrate and hence, a high production speed is achieved. The rolling can also be performed while the sintered/reduced copper foil is still hot, i.e. at a temperature of over 300° C., in which case the formation of the electrically conductive pattern on the carrier substrate and the sintering/reduction and rolling can all be carried out on the same production line.

Another process step, which is not necessary in all cases is a passivation step in which copper is passivated in such a manner that oxidation is prevented. The passivation step is usually performed by using suitable chemicals.

In the next process step, the electrically conductive pattern is transferred to the application substrate. The surface of the application substrate is arranged to form an adhesion surface having an adhesion to the electrically conductive pattern that is greater than the adhesion of the substantially non-adhesive surface of the carrier substrate. The application substrate is preferably a flexible continuous web, for example a polyester, polyethylene, polypropylene or paper web, which is provided with an adhesive. Another alternative is that the electrically conductive pattern has adhesive on its surface. The adhesive on the web receives the electrically conductive pattern, and the pattern is released from the carrier substrate. The adhesive can be a pressure sensitive adhesive, a thermoplastic adhesive or an adhesive, which is curable by heat, radiation or by a chemical reaction. For example, ultraviolet or electron beam curing are suitable methods. After the transfer of the electrically conductive pattern has happened the application substrate can be reeled up and conveyed to another production line, or the process can be continued on the same production line in such a manner that practically all the process steps required to get sequential ready transponders on a continuous web are conducted on the same production line. However, also intermediate forms of the process may exist. In one embodiment of the invention, it is possible to attach the chip on the carrier substrate and transfer it with the electrically conductive pattern to the application substrate. In another embodiment, conductive leads of modules can be formed by the method of the invention.

The graphite substrate is led to reuse. First it is abraded to remove remnants of metal and after that follows a washing and drying sequence after which it is ready to be printed again.

By this method, it is also possible to produce multi-layer conductor structures. In an embodiment, on top of a first layer is formed a second layer from an electrically conductive material. To allow the superimposed electrically conductive patterns to be at different potentials during use, an electrically insulating dielectric layer is formed on the first layer, and a second layer is only then formed on the dielectric layer. The second layer may be formed from the same material or a different material than the underlying first layer. The material of the second layer may be selected from the following group: copper, silver, gold, platinum, palladium, oxides of copper, silver, gold, platinum, palladium or mixtures of these. The second layer is formed before the metallization and sintering of the first layer, in other words, while the lower electrically conductive pattern remains in an oxidic form. A prerequisite for this embodiment is that the dielectric layer resists high temperatures. Alternatively, the second layer may be formed after the metallization and sintering of the first layer. The second layer is preferably formed in the same way as the first layer. The metal foil structure may comprise several electrically conductive layers one upon the other, separated by a dielectric layer.

In an embodiment of the method, the copper foil forms an electrically conductive pattern for a circuit board, and the application substrate onto which the electrically conductive pattern is transferred is a rigid circuit board substrate.

In an embodiment of the method, as previously mentioned, in addition to the circuitry pattern, i.e. antenna, also other electrically conductive parts of the transponder, such as capacitor plates and leads, can be formed by the method of the invention.

DESCRIPTION OF THE DRAWINGS

In the following, the invention will be described in detail by the aid of an embodiment example with reference to the attached drawing, wherein.

DETAILED DESCRIPTION

Figure 1:
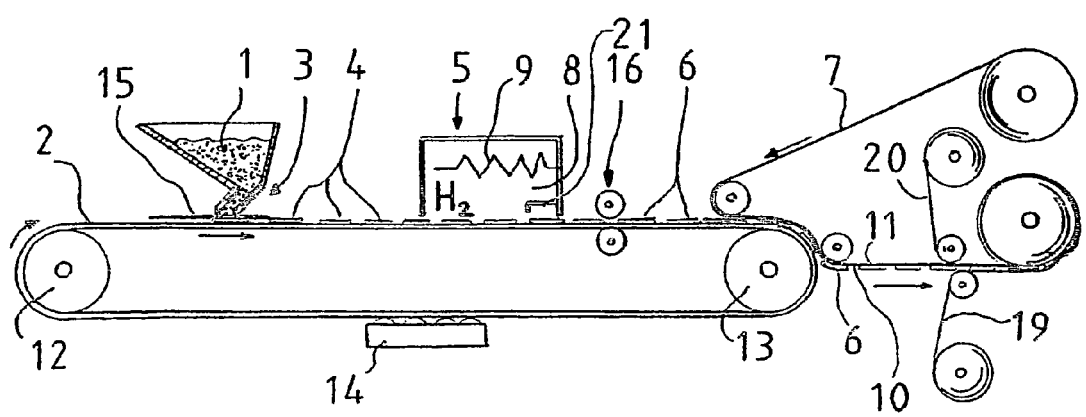
FIG. 1 presents a diagram representing an embodiment of the system of the invention for implementing an embodiment of the method of the invention.

FIG. 1 presents an example of a manufacturing line of an electrically conductive pattern. Active, fine-grained copper (I)oxide powder having a grain size of the order of 10 µm or less (typically 0.5-10 µm has been produced by precipitating from a water solution at a controlled temperature, solution strength and other conditions controlling the properties, by drying into powdery form and by treating so as to improve durability. An alloying element can be added to the copper (1)oxide powder, said alloying element being selected from the group: silver, gold, platinum, palladium, oxides of silver, gold, platinum and palladium, halogenides of silver, gold, platinum, palladium or mixtures of these. The powder may additionally be treated with organic reducing acids, such as acetic acid, oxalic acid or formic acid.

A paste 1 is produced by mixing copper(1)oxide powder prepared as described above, an organic binding agent, such as polyvinylbutyral (PVB) or dibutylphtalate (DBP), and other additives for controlling the rheology, creep, adhesion etc. of the paste, which is used as a printing ink for printing a blank of an electrically conductive pattern 4 having the shape of a desired electrically conductive pattern as a layer of a thickness of 5-100 µm on the surface of a carrier substrate 2. The preferred printing methods are screen printing methods, such as silk printing. The paste 1 may also be applied onto the carrier substrate 2 by any other technique known to the person skilled in the art, such as impression printing techniques, or by methods like computer output techniques. To mention suitable printing techniques, silk, tampo, flexo, gravure, inkjet, laser and litho printing come in question. The electrically conductive pattern can be merely a circuitry pattern, or it can also comprise for example a capacitor plate capacitor plates.

In the example presented in FIG. 1, the carrier substrate 2 shown is an endless moving band, which is passed over a drive roll 12 and a diverting roll 13. Alternatively, the carrier substrate 2 used may consist of separate sheets carried successively (not shown) on the production line. The formation of the blank of the electrically conductive pattern 4 on the surface of the carrier substrate 2 as well as the other subsequent manufacturing steps are performed on the upper horizontal portion of the carrier band 2. At some point along the lower portion of the carrier band 2, a regenerating device 14 for restoring the characteristics of the band surface may be provided.

The blank of the electrically conductive pattern 4 is formed by printing the paste 1 onto the surface of the carrier substrate 2 by means of a forming device 3, which in the example in FIG. 1 is a silk-screen printing device shown in a diagrammatic form, which squeegees the paste 1 through a mask 15 comprising a part that has the shape of the electrically conductive pattern and admits the paste 1 through it onto the surface of the carrier belt 2 to form successive and/or adjacent electrically conductive patterns 4. The carrier belt 2 conveys the blanks of the electrically conductive patterns 4 to a metallizing and sintering device 5, where the blanks of the electrically conductive patterns 4 on the surface of the carrier belt are metallized and sintered in a hydrogen atmosphere and at a temperature of about 1000° C., forming electrically conductive and continuous copper foils 6. The metallizing and sintering device 5 comprises a chamber 8 filled to receive the carrier substrate 2 into the space inside it. The chamber 8 contains a hydrogen atmosphere as mentioned above. The heating device 9 used to heat the electrically conductive pattern may be an IR or microwave radiation source or any other heating device known to the person skilled in the art.

After metallizing and sintering device 5, the electrically conductive patterns 6 may be rolled on the carrier band 2 by the action of a roller pair 16 to a suitable thickness. Usually the above-mentioned process step can be omitted.

The carrier belt 2 or at least that surface of it on which the blank of the electrically conductive pattern is formed is made of a substantially non-adhesive material that is capable of withstanding the metallizing and/or sintering temperature and that does not react with the substances contained in the paste 1. The carrier band 2 is preferably made of graphite, which has been polished to a surface roughness $R_a$ of the order of 0.5 µm or less and from which the electrically conductive pattern 6 can be easily detached and transferred onto the first surface 10 of an application substrate 7. The first surface 10 of the application substrate 7 has an adhesive layer on it. The first surface 10 of the application substrate 7 has an adhesion to the electrically conductive pattern 6 that is greater than the adhesion of the substantially non-adhesive surface of the carrier substrate 2. The electrically conductive patterns are transferred in successive order by transfer lamination. The adhesive layer touches the surface of the carrier belt 2 and the electrically conductive pattern is released from the carrier belt 2 by adhesive forces, and thus the pattern is transferred to the application substrate 7, which in this case is a continuous flexible web.

After the transfer lamination, suitable protective additional layers may be laminated on one side or both sides of the aforesaid web in a known manner, such layers being indicated in the figure by reference numbers 19 and 20. The price of an RF-ID antenna produced by the method of the invention is a fraction of the price of a tag produced by prior-art methods.

Figure 2:
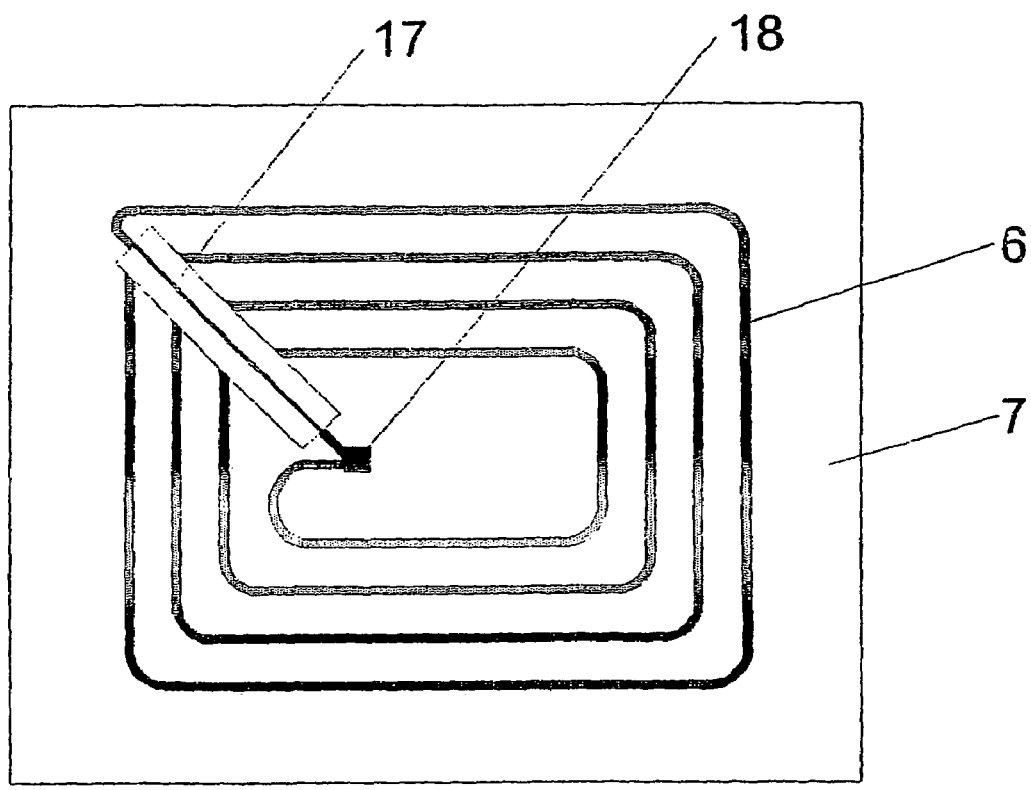
FIGS. 2, 3a, 3b show transponders.
Figure 3A:
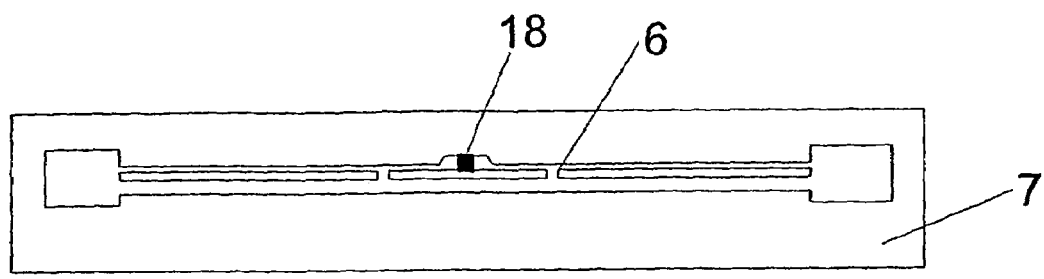
Figure 3B:
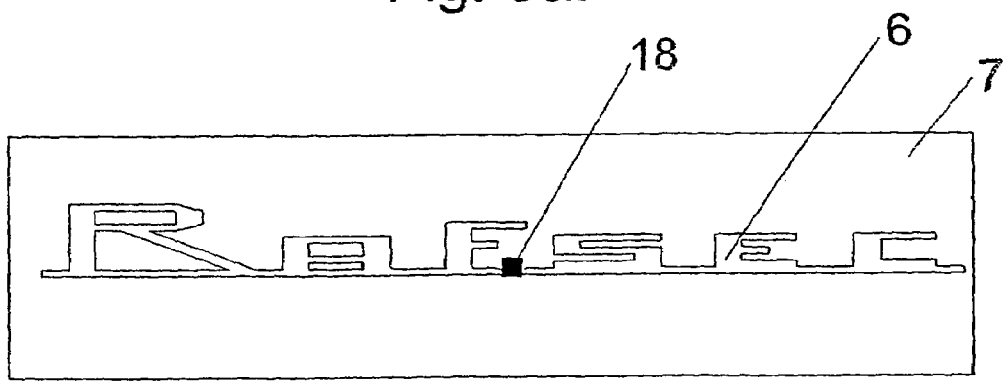

Also referring to FIGS. 2, 3a and 3b, the method is applicable for the manufacture of transponders. Generally, an integrated circuit on a chip can be attached directly to the circuitry pattern, or the chip has been first attached to a separate module, which is attached to the application substrate. The techniques used for connecting the chip or the module are known as such. The transponders described in FIGS. 2, 3a and 3b comprise on the application substrate 7 an integrated circuit on a chip 18 and a circuitry pattern 6 but instead of the bare chip 18, also the module can be used. When an electrical connection is formed between the circuitry pattern 6 and the module comprising the chip 18 it is possible that the connection is formed through at least one capacitor. In FIG. 2, an electrically insulating pattern 17 have been formed to separate electrically conductive leads from each other. The application substrate 7 receiving the circuitry pattern 6 is made of plastic, paper or a similar flexible material. The material of the module can be of the same material as the application substrate 7, or it can be of another material.

As seen in FIGS. 2, 3a and 3b the configuration of the circuitry pattern can vary enormously. The circuitry pattern shown in FIG. 2 is a coil-antenna intended for use in the HF region, the circuitry patterns shown in FIGS. 3a and 3b are intended for use in the UHF region.

Although the above presentation describes the manufacture of an RF-ID tag as a special application, the method and system of the invention may also be applicable in the manufacture of circuit boards and the like. When the copper foil forms an electrically conductive pattern for a circuit board, the application substrate onto which the copper foil is transferred is a circuit board blank.

By following the principles described above, the system can be easily converted for the manufacture of multi-layer foil structures e.g. by providing in the production line a number of forming devices 3 and metallizing and sintering devices 5 corresponding to the number of successive layers to be formed. A multi-layer foil structure comprises two or more superimposed conductor layers formed in the aforesaid manner and separated from each other by electrically insulating intermediate layers.

In the following figures, arrows denote direction of motion of a web.

Figure 4:
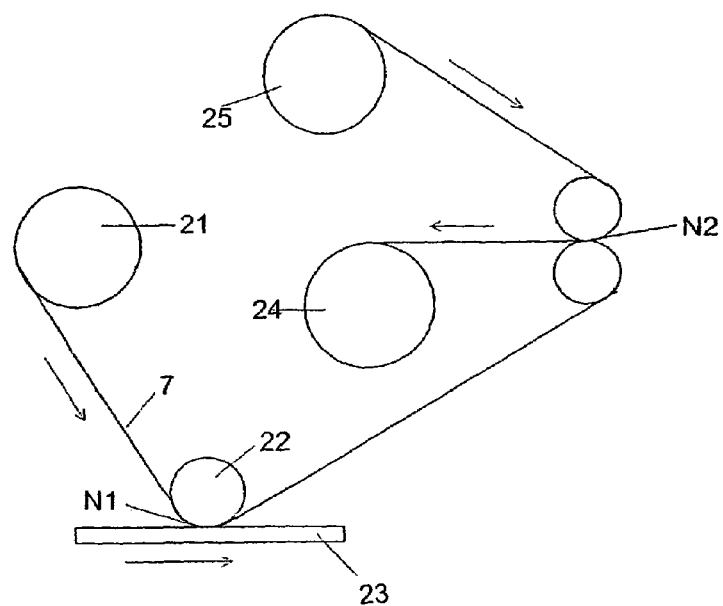
FIGS. 4-6 show process steps of the manufacturing method of the invention.

FIG. 4 shows one process step of the production line of the 35 process of the invention. The continuous plastic web W, such as a polyester web, is unwound from a roll 21. On the surface of the web W is an adhesive layer, which receives electrically conductive patterns in a continuous manner from a printing surface 23 in a nip N1, which has been formed between the printing surface 23 and a backing roll 22. In this example, the printing surface 23 acts as the carrier substrate and the web W acts as the application substrate. In the next process step, the web W provided with successive and/or adjacent electrically conductive patterns is attached to siliconized paper unwound from a roll 25. The attachment takes place in a nip N2. A roll 24 is ready to be transferred to the following production line. When the next step of the manufacturing process is conducted on the same production line and the web is not wound it is not necessary to attach the siliconized paper.

Figure 5:
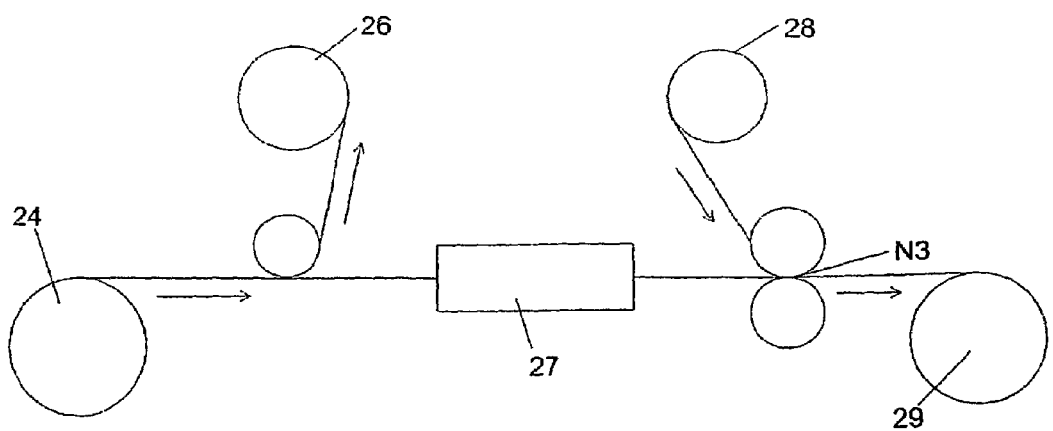

FIG. 5 shows the next step of the manufacturing process of the transponder. The roll 24 is unwound, and the siliconized paper is released from the web W and wound to a roll 26. Integrated circuits on a chip are attached to the web in an attachment unit 27. A suitable face material is unwound from a roll 28, and it is attached to the web W in a nip N3. The resulting web is wound to a roll 29.

Figure 6:
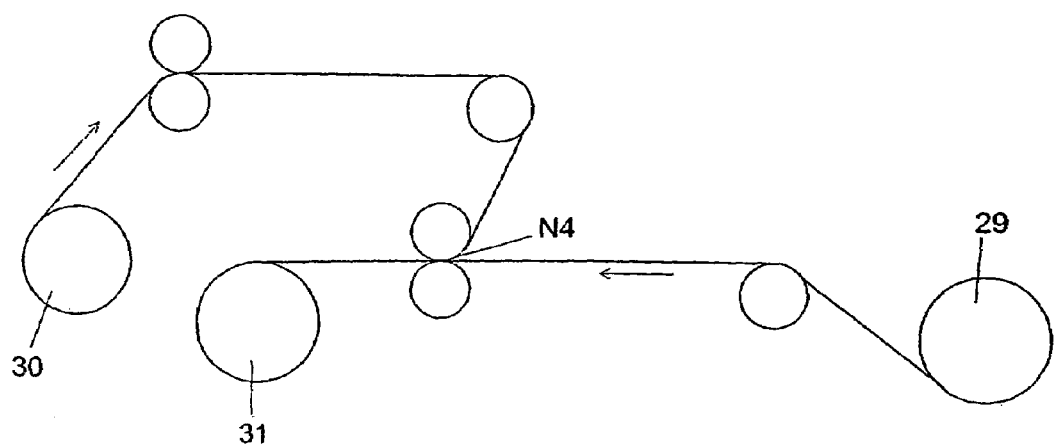

FIG. 6 shows the following process step. However, this step can also be omitted from the process steps. The web is unwound from the roll 29, and a siliconized paper is unwound from a roll 30, and the webs are attached together in such a manner that the siliconized paper is on a reverse side of the web W compared to the face material. The siliconized paper has adhesive on its surface; the adhesive joins the webs together in a nip N4. A ready laminate comprising successive and/or adjacent circuitry patterns, integrated circuits on chips, which are electrically connected to the circuitry patterns, and webs on both sides of the web W, is wound to a roll 31.

The invention is not limited to the embodiment examples described above; instead, many variations are possible within the scope of the inventive concept defined in the claims.

What is claimed is:

1. A method for manufacturing an electrically conductive pattern, the method comprising:
   printing a layer comprising metal oxide on a surface of a carrier substrate;
   reducing the metal oxide to metal; and
   transferring the reduced layer to an application substrate,
   wherein the metal oxide comprises copper oxide, and
      wherein the method further comprises forming a paste with a fine-grained copper oxide powder having a particle size of the order of 10 μm or less, a binding agent and optional alloying elements and additives;
   applying the paste in a desired shape on the surface of the carrier substrate; and
   metallizing and sintering the copper oxide in the paste on the surface of the carrier substrate at an elevated temperature in order to form an electrically conductive pattern,
   the carrier substrate, having a substantially non-adhesive surface to allow the electrically conductive pattern to be detached from the carrier substrate, the non-adhesive surface being made of a material capable of withstanding the elevated temperatures used for the metallization and sintering and the surface of the carrier substrate non-reacting with the substances contained in the paste,
   wherein the electrically conductive pattern is a circuitry pattern of a transponder, and an integrated circuit on a chip is electrically connected to the circuitry pattern, and
   wherein an electrical contact is formed between the circuitry pattern and the chip before transferring the electrically conductive pattern to the application substrate.

2. The method according to claim 1, wherein the electrically conductive pattern is heated by infrared radiation or microwave radiation for the metallization and sintering.

3. The method according to claim 1, wherein the copper oxide powder comprises copper(I)oxide prepared from a water solution by precipitating at a controlled temperature, solution strength and other conditions which are effective for producing an active, fine-grained, pure and homogenous copper oxide powder when the powder is dried.

4. The method according to claim 1, wherein the copper oxide powder is treated with an organic intermediate agent to form a reducing compound on surfaces of the copper oxide particles, the organic intermediate agent selected from the group consisting of acetic acid, oxalic acid, formic acid and mixtures thereof.

5. The method according to claim 4, wherein the alloying element is mixed in the copper oxide powder to form a homogenous alloy, the alloying element being selected from the group consisting of silver, gold, platinum, palladium, oxides of silver, gold, platinum and palladium, halogenides of silver, gold, platinum, palladium and mixtures thereof.

6. The method according to claim 5, wherein an organic binding agent is mixed in the copper oxide, the organic binding agent selected from the group consisting of polyvinylbutyral, dibutylphtalate and mixtures thereof.

7. The method according to claim 6, wherein the alloying elements are effective for controlling at least one of the properties selected from the group consisting of rheology, creep and adhesion.

8. The method according to claim 1, wherein the electrically conductive pattern is formed as a paste layer having a thickness of about 5 to about 100 μm, and wherein the pattern is formed by the techniques selected from the group consisting of silk-screen printing, tampo printing, flexo printing, gravure printing, litho printing, inkjet printing and a laser output technique.

9. The method according to claims 1 or 8, wherein the metallization and sintering of the copper oxide form the electrically conductive pattern and are performed in an atmosphere comprising hydrogen and at a temperature exceeding 500° C.

10. The method according to claim 9, wherein the method further comprises cooling the electrically conductive pattern after metallization and sintering, the cooling in an atmosphere containing nitrogen gas.

11. The method according to claim 1, wherein the method further comprises applying at least one dielectric layer over the surface of the carrier substrate which has the metal oxide applied thereto and applying at least one second layer to the dielectric layer, the surface of the second layer having the metal oxide applied thereto, and simultaneously reducing the metal oxide to metal on the carrier substrate and second layer.

12. The method according claim 1, wherein the printing forms a pattern which will be made electrically conductive, the method further comprising forming at least one dielectric layer on top of the pattern, and applying at least one second layer comprising metal oxide to the at least one dielectric layer, and reducing the metal oxide on the carrier substrate and the second layer to metal.

13. The method according to claim 1, wherein the application substrate is in a web form, and it is capable for receiving successive, adjacent electrically conductive patterns.

14. The method according to claim 13, wherein the electrically conductive pattern is attached to the application substrate by a pressure sensitive adhesive.

15. The method according to claim 13, wherein the electrically conductive pattern is attached to the application substrate by a thermoplastic adhesive or heat curable adhesive.

16. The method according to claim 13, wherein the electrically conductive pattern is attached to the application substrate by an adhesive, which can be cured by radiation, electron beam, or by a chemical reaction.

17. A method for manufacturing an electrically conductive pattern, the method comprising:

printing a layer comprising metal oxide on a surface of a carrier substrate;

reducing the metal oxide to metal; and transferring the reduced layer to an application substrate, wherein the metal oxide comprises copper oxide, and wherein the method further comprises forming a paste with a fine-grained copper oxide powder having a particle size of the order of 10 µm or less, a binding agent and optional alloying elements and additives;

applying the paste in a desired shape on the surface of the carrier substrate; and metallizing and sintering the copper oxide in the paste on the surface of the carrier substrate at an elevated temperature in order to form an electrically conductive pattern, the carrier substrate, having a substantially non-adhesive surface to allow the electrically conductive pattern to be detached from the carrier substrate, the non-adhesive surface being made of a material capable of withstanding the elevated temperatures used for the metallization and sintering and the surface of the carrier substrate non-reacting with the substances contained in the paste, wherein the electrically conductive pattern is a circuitry pattern of a transponder, and an integrated circuit on a chip is electrically connected to the circuitry pattern, and wherein an electrical contact is formed between the circuitry pattern and the chip after transferring the electrically conductive pattern to the application substrate.

18. The method according to claim 9, wherein the method further comprises attaching at least one additional material layer to the application substrate to cover the electrically conductive pattern, or attaching at least one material layer to the side of the application substrate which is opposite to the side which has the electrically conductive pattern.

* * * * *